US007626462B1

(12) United States Patent
Hietala et al.

(10) Patent No.: US 7,626,462 B1
(45) Date of Patent: Dec. 1, 2009

(54) FRACTIONAL-N BASED DIGITAL AFC SYSTEM WITH A TRANSLATIONAL PLL TRANSMITTER

(75) Inventors: Alexander Wayne Hietala, Phoenix, AZ (US); Ryan Lee Bunch, Greensboro, NC (US); Scott Robert Humphreys, Greensboro, NC (US); Barry Travis Hunt, Jr., Greensboro, NC (US); Stephen T. Janesch, Greensboro, NC (US)

(73) Assignee: RF Micro Devices, Inc., Greensboro, NC (US)

( * ) Notice: Subject to any disclaimer, the term of this patent is extended or adjusted under 35 U.S.C. 154(b) by 170 days.

(21) Appl. No.: 11/415,578

(22) Filed: May 2, 2006

(51) Int. Cl.
*H03L 7/00* (2006.01)
(52) U.S. Cl. ......................................................... 331/2
(58) Field of Classification Search .................. 331/2, 331/10, 11
See application file for complete search history.

(56) References Cited

U.S. PATENT DOCUMENTS

| | | | |
|---|---|---|---|
| 4,542,533 A * | 9/1985 | Parker | 455/182.2 |
| 5,493,700 A | 2/1996 | Hietala et al. | |
| 5,610,559 A * | 3/1997 | Dent | 331/2 |
| 5,812,590 A | 9/1998 | Black et al. | |
| 5,856,766 A * | 1/1999 | Gillig et al. | 331/176 |
| 6,321,075 B1 * | 11/2001 | Butterfield | 455/313 |
| 6,898,420 B2 | 5/2005 | Black et al. | |
| 7,098,754 B2 | 8/2006 | Humphreys et al. | |
| 2004/0086057 A1 * | 5/2004 | Lee et al. | 375/295 |
| 2004/0198278 A1 * | 10/2004 | Chien | 455/147 |

* cited by examiner

*Primary Examiner*—Robert Pascal
*Assistant Examiner*—Gerald Stevens
(74) *Attorney, Agent, or Firm*—Withrow & Terranova, P.L.L.C.

(57) ABSTRACT

A fractional-N based Automatic Frequency Control (AFC) system for a mobile terminal is provided. In general, automatic frequency control is implemented in a frequency synthesizer to correct or compensate for a frequency error of an associated reference oscillator. The frequency synthesizer includes a first fractional-N phase-locked loop (FN-PLL) generating a baseband clock signal used by a baseband processor of the mobile terminal, a second FN-PLL generating a receiver local oscillator signal used by a receiver of the mobile terminal to downconvert a received radio frequency signal to a desired frequency, and a translational PLL generating a transmitter local oscillator signal used by a transmitter of the mobile terminal to provide a radio frequency transmit signal. The automatic frequency control is performed by applying a digital correction value, which is preferably multiplicative, to fractional-N dividers of the first and second FN-PLLs.

20 Claims, 3 Drawing Sheets

FRACTIONAL-N BASED DIGITAL AFC SYSTEM WITH A TRANSLATIONAL PLL TRANSMITTER

FIELD OF THE INVENTION

The present invention relates to a digital Automatic Frequency Control (AFC) system for a mobile terminal and more specifically relates to a fractional-N based digital AFC system.

BACKGROUND OF THE INVENTION

All communications systems rely on a precise reference oscillator to determine the output frequency of the system. The reference oscillator is typically a crystal oscillator. A typical crystal oscillator has an accuracy of approximately ±30-40 parts-per-million (ppm). However, communications standards, such as the Global System for Mobile Communications (GSM) standard, require a reference oscillator with an accuracy of at least ±0.02 ppm. In order to obtain the desired accuracy, the frequency of the crystal oscillator is typically corrected by warping the crystal with a varactor diode variable capacitance driven by a precision Digital-to-Analog (D/A) converter or by controlling individual capacitive elements in a precision capacitor array.

One issue with the above system that significant factory calibration of either the precision D/A converter controlling the capacitance of the varactor diode or the precision capacitor array must be performed. Further, even after calibration, the control of the D/A converter or capacitor array is not precise, and, as such, the frequency correction algorithm must make multiple iterations to accurately correct the frequency of the reference oscillator.

One alternative is to purchase a relatively expensive temperature compensated crystal oscillator (TCXO) sub-assembly for the communications system. However, even for these TCXO sub-assemblies, frequency correction is typically required to obtain the desired accuracy and precision.

Thus, there remains a need for a system and method for correcting or compensating for a frequency error of a reference oscillator.

SUMMARY OF THE INVENTION

The present invention provides a fractional-N based Automatic Frequency Control (AFC) system for a mobile terminal. In general, automatic frequency control is implemented in a frequency synthesizer generating a baseband clock signal used by a baseband processor of the mobile terminal, a receiver local oscillator signal used by a receiver of the mobile terminal to downconvert a received radio frequency signal to a desired frequency, and a transmitter local oscillator signal used by a transmitter of the mobile terminal to provide a radio frequency transmit signal.

The frequency synthesizer includes a reference oscillator providing a reference signal, a first fractional-N phase-locked loop (FN-PLL) providing a first local oscillator signal related to the baseband clock signal, a second FN-PLL providing a second local oscillator signal related to the receiver local oscillator signal, and a translational PLL providing the transmitter local oscillator signal. The first FN-PLL generates a first local oscillator signal related to the baseband clock signal based on the reference signal. The first FN-PLL includes a first fractional-N divider controlling a frequency of the first local oscillator signal based on a first nominal fractional divide value corresponding to a desired frequency of the baseband local oscillator signal and a first automatic frequency control (AFC) value compensating for a frequency error of the reference oscillator. The second FN-PLL generates a second local oscillator signal related to the receiver local oscillator signal based on the reference signal. The second FN-PLL includes a second fractional-N divider controlling a frequency of the second local oscillator signal based on a second nominal fractional divide value corresponding to a desired frequency of the receiver local oscillator signal and a second AFC value compensating for a frequency error of the reference oscillator. The translational PLL provides the transmitter local oscillator signal at a desired frequency based on the second local oscillator from the second FN-PLL and a combined fractional divide value N1.

In one embodiment, the first and second AFC values are related. In another embodiment, the first and second AFC values are essentially equal. Further, the first and second AFC values may be multiplicative AFC values corresponding to a parts-per-million frequency error of the reference oscillator. As such, the first and second AFC values may remain constant over frequency as the receive or transmit frequency is varied.

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

DETAILED DESCRIPTION OF THE PREFERRED EMBODIMENTS

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

Figure 1:
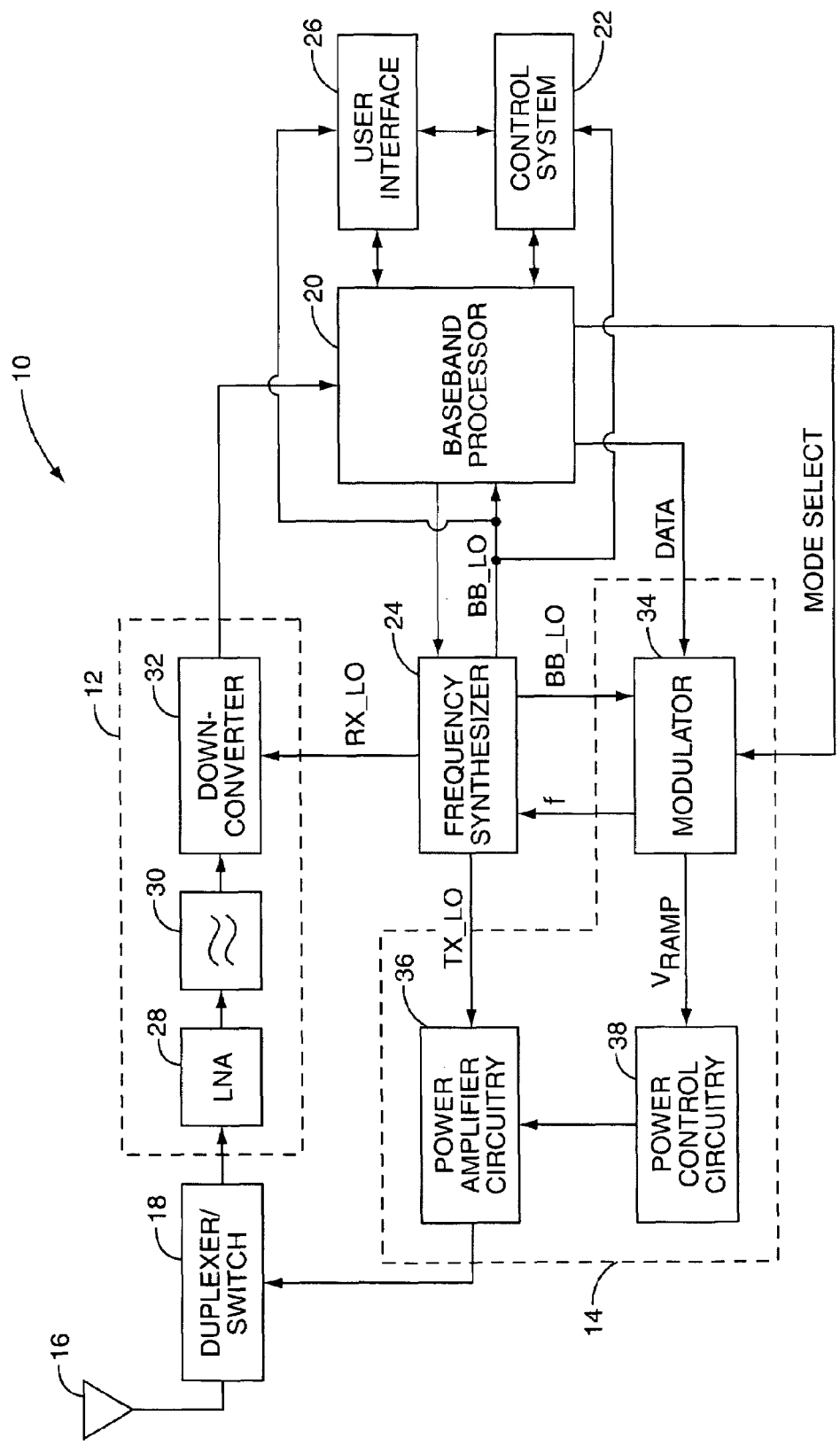
FIG. 1 illustrates an exemplary mobile terminal incorporating a frequency synthesizer, wherein the frequency synthesizer corrects or compensates for a frequency error of a reference oscillator according to one embodiment of the present invention.

The present invention is preferably incorporated in a mobile terminal 10, such as a mobile telephone, personal digital assistant, wireless Local Area Network (LAN) device, a base station in a mobile network, or the like. The basic architecture of a mobile terminal 10 is represented in FIG. 1, and may include a receiver front end 12, a radio frequency transmitter section 14, an antenna 16, a duplexer or switch 18, a baseband processor 20, a control system 22, a frequency synthesizer 24, and a user interface 26. The receiver front end 12 receives information bearing radio frequency signals from one or more remote transmitters provided by a base station (not shown). A low noise amplifier (LNA) 28 amplifies the signal. A filter circuit 30 minimizes broadband interference in the received signal, while a downconverter 32 downconverts the filtered, received signal to an intermediate or baseband frequency signal, which is then digitized into one or more digital streams. The receiver front end 12 typically uses one or more mixing frequencies, which are referred to herein as receiver local oscillator signals (RX_LO), generated by the frequency synthesizer 24.

The baseband processor 20 processes the digitized, received signal to extract the information or data bits conveyed in the received signal. This processing typically comprises demodulation, decoding, and error correction operations. As such, the baseband processor 20 is generally implemented in one or more digital signal processors (DSPs). The baseband processor 20 operates based on a baseband clock, or baseband local oscillator signal (BB_LO), from the frequency synthesizer 24.

On the transmit side, the baseband processor 20 receives digitized data from the control system 22, which it encodes for transmission. The control system 22 may run software stored in associated memory. Alternatively, the operation of the control system 22 may be a function of sequential logic structures as is well understood. After encoding the data from the control system 22, the baseband processor 20 outputs the encoded data to the radio frequency transmitter section 14. A modulator 34 receives the data from the baseband processor 20 and operates according to one or more modulation schemes to provide a modulated signal to the power amplifier circuitry 36. The modulation scheme of the modulator 34 is controlled by a mode select signal (MODE SELECT) from the control system 22.

In general, in one embodiment, the modulator 34 operates according to the Global System for Mobile Communications (GSM) standard. More specifically, the modulator 34 may operate according to either an 8-Level Phase Shift Keying (8PSK) modulation scheme, which is a modulation scheme containing both amplitude and phase components, or a Gaussian Minimum Shift Keying (GMSK) modulation scheme, which is a constant amplitude modulation scheme. When in 8PSK mode, the modulator 34 provides a phase modulation component, which is referred to herein as a frequency deviation signal (f), to the frequency synthesizer 24. In response, the frequency synthesizer 24 generates a phase, or frequency, modulated signal at a desired transmit frequency to the power amplifier circuitry 36, as discussed below. In this example, the phase modulated signal corresponds to a transmit local oscillator signal (TX_LO). In addition, the modulator 34 provides a power control signal ($V_{RAMP}$) comprising an amplitude modulation component and a ramping signal component to the power control circuitry 38. The ramping signal component defines the transmit burst. The power control circuitry 38 controls an output power of the power amplifier circuitry 36 based on the power control signal ($V_{RAMP}$), thereby providing amplitude modulation of the phase modulated signal provided to the power amplifier circuitry 36.

When in GMSK mode, the modulator 34 provides a phase modulation component, or frequency deviation signal, to the frequency synthesizer 24. In response, the frequency synthesizer 24 generates a phase, or frequency, modulated signal at a desired transmit frequency to the power amplifier circuitry 36. In addition, the modulator 34 provides the power control signal ($V_{RAMP}$) to the power control circuitry 38. However, in GMSK mode, the power control signal ($V_{RAMP}$) includes only the ramping signal component defining the transmit burst, as will be apparent to one of ordinary skill in the art upon reading this disclosure.

The power amplifier circuitry 36 amplifies the phase modulated signal from the frequency synthesizer 24 to a level appropriate for transmission from the antenna 16. A gain of the power amplifier circuitry 36 is controlled by the power control circuitry 38. In essence, the power control circuitry 38 operates to control a supply voltage provided to the power amplifier circuitry 36.

A user may interact with the mobile terminal 10 via the user interface 26. As will be apparent to one of ordinary skill in the art upon reading this disclosure, the user interface 26 may include components such as, but not limited to, a microphone, a speaker, a keypad, and a display. Additionally, the user interface 26 may include a voice encoder/decoder, in which case it may communicate directly with the baseband processor 20.

Figure 2:
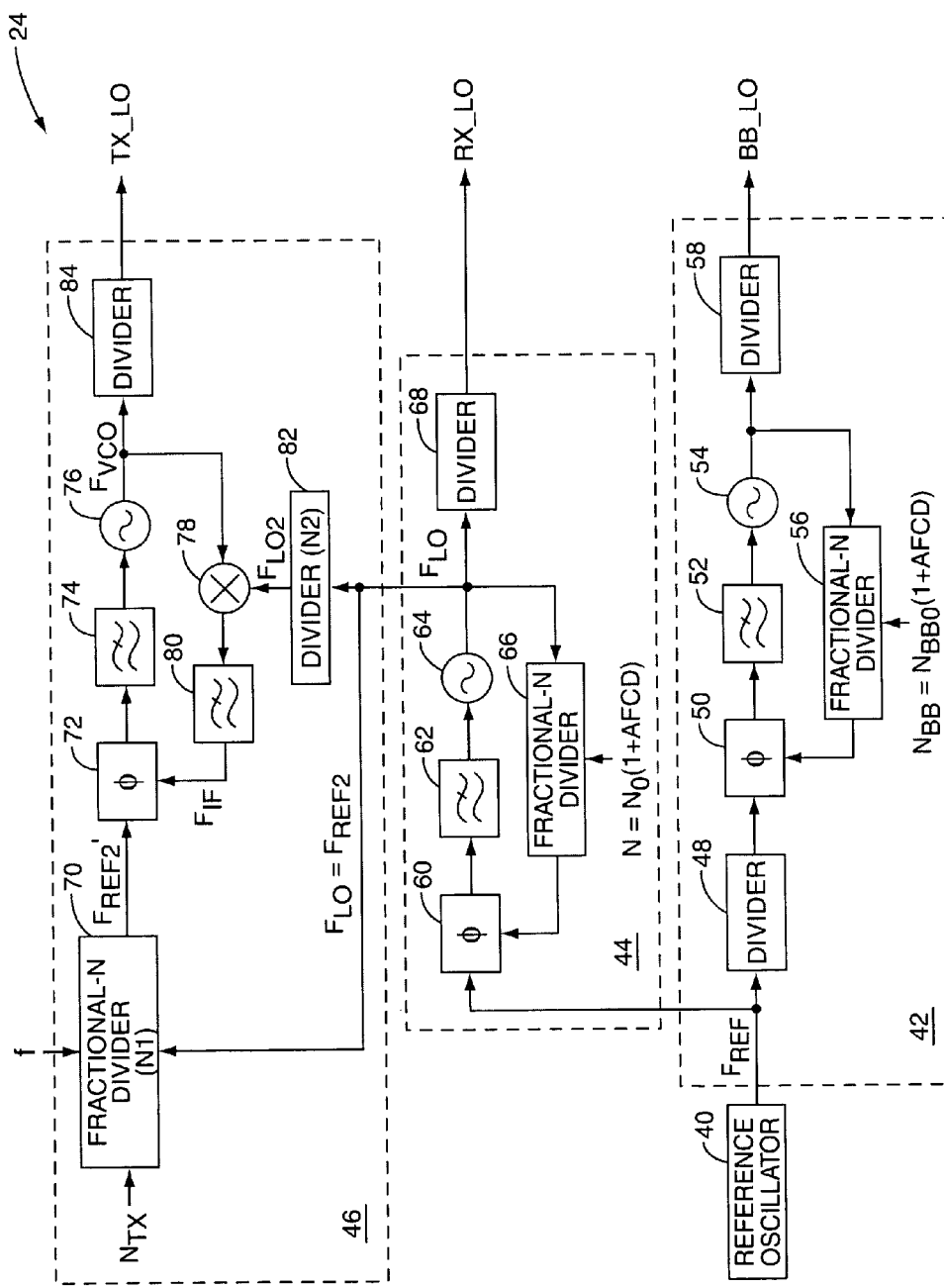
FIG. 2 illustrates a frequency synthesizer according to one embodiment of the present invention.

FIG. 2 is a more detailed illustration of the frequency synthesizer 24 according to one embodiment of the present invention. In general, the frequency synthesizer 24 includes a reference oscillator 40, a first FN-PLL 42, a second FN-PLL 44, and a translational FN-PLL 46. The reference oscillator 40 may be, for example, a free-running crystal oscillator. However, the present invention is not limited thereto. The reference oscillator 40 may be any oscillator circuitry providing a reference signal ($F_{REF}$). For example, the reference oscillator 40 may alternatively be a temperature compensated crystal oscillator (TCXO) sub-assembly. As will be apparent to one of ordinary skill in the art, the reference oscillator 40 has an inherent frequency error. For example, the ideal frequency of the reference signal ($F_{REF}$) may be 26 MHz. However, the actual frequency of the reference signal ($F_{REF}$) may be, for example, 26.001 MHz. Communications standards, such as the GSM standard, require at least ±0.02 parts-per-million accuracy. Thus, AFC is required to compensate for the frequency error of the reference oscillator 40. As discussed below, the present invention provides AFC by applying a digital AFC value (AFCD) to both the first and second FN-PLLs 42 and 44.

The first FN-PLL 42 operates to provide a baseband local oscillator signal (BB_LO), which may also be referred to as a baseband clock signal, based on the reference signal ($F_{REF}$) provided by the reference oscillator 40. Before discussing the details of the first FN-PLL 42, it should first be noted that communication standards, such as the GSM standard, require that the baseband clock be accurate and synchronized to the received signal. If it is not, the baseband processor 20 will slip timing with respect to the received signal, which results in lost data bits, as will be apparent to one of ordinary skill in the art upon reading this disclosure.

The first FN-PLL 42 includes an optional divider 48, a phase detector 50, a loop filter 52, a voltage controlled oscillator (VCO) 54, and fractional-N divider 56, and another optional divider 58 arranged as shown. In operation, the divider 48, which again is optional, may divide the reference signal ($F_{REF}$) from the reference oscillator 40 by an integer value such as, for example, 1 or 2. The output of the divider 48 is coupled to a first input of the phase detector 50. A second input of the phase detector 50 is coupled to the output of the fractional-N divider 56 to receive a feedback signal. The fractional-N divider 56 provides the feedback signal by fractionally dividing a VCO output signal provided by the VCO 54 by a fractional divide value ($N_{BB}$). The fractional divide value ($N_{BB}$) is equal to an ideal, or nominal, fractional divide value ($N_{BB0}$) multiplied by an AFC term (1+AFCD), where AFCD is the digital AFC value. The AFCD value compensates for the frequency error of the reference oscillator 40 and is determined, or computed, during a frequency correction process, which is described below in detail. It should be noted that in this preferred embodiment, the AFCD value is applied as a multiplicative term. More specifically, the AFCD value is a reference frequency error ratio, or parts-per-million (ppm) error, of the reference oscillator 40. As such, the AFCD value is the same for any desired output frequency. The fractional divide value ($N_{BB}$) may be provided by external logic such as, but not limited to, the control system 22 (FIG. 1). Alternatively, the ideal fractional divide value ($N_{BB0}$) and the AFCD value may be provided to the frequency synthesizer 24 and combined by logic to provide the divide value ($N_{BB}$), as will be apparent to one of ordinary skill in the art upon reading this disclosure.

The phase detector 50 operates to compare a phase of the divided reference signal output by the divider 48 and a phase of the feedback signal output by the fractional-N divider 56 to provide an error signal. The error signal is low-pass filtered by the loop filter 52 to provide a control signal to the VCO 54. Based on the control signal, the VCO 54 provides the VCO output signal at the desired output frequency. The optional divider 58 may then divide the VCO output signal by an integer divide value to provide the baseband local oscillator signal (BB_LO).

As an example, the ideal frequency output by the reference oscillator 40 may be 26 MHz, the ideal fractional-N divide value ($N_{REF0}$) may be 12, and the divide value of the dividers 48 and 58 may be 1 and 12, respectively. However, the actual frequency of the reference signal ($F_{REF}$) output by the reference oscillator 40 may be 26.001 MHz. Thus, as described below, the AFCD value may be computed to be $-3.8461538 \times 10^{-5}$. Thus, the frequency of the VCO output signal will be $26.001 \text{ MHz} \times (12 \times (1 - 3.8461538 \times 10^{-5}))$, which is 312 MHz, and the baseband LO signal (BB_LO) output by the divider 58 will be 26 MHz (312 MHz/12). In contrast, if no AFC value were used, the frequency of the VCO output signal would be 312.012 MHz, and the frequency of the baseband LO signal (BB_LO) would be 26.001 MHz, which would result in a substantial loss of bits in the baseband processor 20.

The second FN-PLL 44 operates to provide a receiver local oscillator signal (RX_LO), which is used by the receiver front end 12 (FIG. 1) to downcovert the received RF signal. The second FN-PLL 44 includes a phase detector 60, a loop filter 62, a VCO 64, a fractional-N divider 66, and optionally a divider 68. In operation, the VCO 64 provides a local oscillator signal ($F_{LO}$). The local oscillator signal ($F_{LO}$) is fractionally divided by the fractional-N divider 66 to provide a feedback signal to one input of the phase detector 60. The reference signal ($F_{REF}$) from the reference oscillator 40 is provided to a second input of the phase detector 60. The phase detector 60 compares a phase of the feedback signal to a phase of the reference signal ($F_{REF}$) and provides an error signal to the loop filter 62. The loop filter 62 filters the error signal from the phase detector 60 to provide a control voltage to the VCO 64. In one embodiment, the loop filter 62 has a narrow bandwidth, such as 90 kHz. The optional divider 68 may then divide the local oscillator signal ($F_{LO}$) by a predetermined integer divide value to provide the receiver local oscillator signal (RX_LO).

The frequency of the local oscillator signal ($F_{LO}$) is controlled by a fractional divide value (N), which is equal to an ideal fractional divide value ($N_0$) multiplied by the AFC term (1+AFCD). The AFCD value compensates for the frequency error of the reference oscillator 40 and is determined, or computed, during a frequency correction process, which is described below in detail. It should be noted that in this preferred embodiment, the AFCD value is applied as a multiplicative term. More specifically, the AFCD value is preferably a reference frequency error ratio, or ppm error, of the reference oscillator 40. As such, the AFCD value is the same for any desired output frequency. The fractional divide value (N) may be provided by external logic such as, but not limited to the control system 22 (FIG. 1). Alternatively, the ideal divide value ($N_0$) and the AFCD value may be provided to the frequency synthesizer 24 and combined by logic to provide the divide value (N), as will be apparent to one of ordinary skill in the art upon reading this disclosure.

The translational PLL 46 operates to provide a transmitter local oscillator signal (TX_LO) for the radio frequency transmitter section 14 (FIG. 1) based on the local oscillator signal ($F_{LO}$) provided by the second FN-PLL 44 and a combined fractional divide value N1. It should be noted that since the translational PLL 46 operates based on the local oscillator signal ($F_{LO}$), rather than the reference signal ($F_{REF}$) from the reference oscillator 40, no further frequency control is needed in the translational PLL 46 to correct for the frequency error of the reference oscillator 40.

In general, the translational PLL 46 includes a fractional-N divider 70, a phase detector 72, a loop filter 74, a VCO 76, a mixer 78, a feedback filter 80, and optionally dividers 82 and 84 arranged as shown. In operation, the fractional-N divider 70 fractionally divides the local oscillator signal ($F_{LO}$), which is the output of the second FN-PLL 44 and a reference frequency ($F_{REF2}$) for the translational PLL 46, based on fractional divide value ($N_{TX}$) and the modulation signal (f) from the modulator 34 to provide divided reference signal ($F_{REF2}'$). The fractional divide value ($N_{TX}$) may be provided by external logic such as, but not limited to, the control system 22 (FIG. 1). As will be apparent to one of ordinary skill in the art, the fractional-N divider 70 includes logic for combining the fractional divide value ($N_{TX}$) and the modulation signal (f) to provide a combined fractional divide value for the fractional-N divider 70, where the combined fractional divide value may be expressed as:

$$N1 = N_{TX} + \text{Modulation},$$

where N1 is the combined fractional divide value and "modulation" is the modulation signal (f) provided by the modulator 34.

The phase detector 72 compares a phase of the divided reference signal ($F_{REF2}'$) output by the fractional-N divider 70 to a phase of an intermediate frequency feedback signal ($F_{IF}$). The output of the phase detector 72 is filtered by the loop filter 74 and provided to the VCO 76 as a control voltage. The loop filter 74 is designed such that the translational PLL 46 has a wide open-loop unity-gain bandwidth. In one embodiment, the translational PLL 46 has a bandwidth of 800 kHz. The wide bandwidth is possible, at least in part, due to the use of the mixer 78 in the feedback path rather than a fractional-N divider as in traditional fractional-N PLLs. Based on the control voltage, the VCO 76 provides the output signal ($F_{VCO}$). Assuming high side injection ($F_{VCO} < F_{LO2}$), the frequency of the output signal ($F_{VCO}$) is defined by the equation:

$$F_{VCO} = F_{REF} \cdot \left( \frac{N}{N2} - \frac{N}{N1} \right),$$

where N is the fractional divide value provided to the fractional-N divider 66 of the second FN-PLL 44, N1 is the combined fractional divide value of the fractional-N divider 70 of the translational PLL 46, and N2 is the divide value of the divider 82. The output signal ($F_{VCO}$) may optionally be divided by divider 84 to provide the transmitter local oscillator signal (TX_LO). As described above with respect to the modulator 34 of FIG. 1, the transmitter local oscillator signal (TX_LO) may be the phase modulated signal and is provided to the input of the power amplifier circuitry 36.

The output signal ($F_{VCO}$) of the VCO 76 is also provided to a feedback path including the mixer 78 and optionally the feedback filter 80. The mixer 78 operates to multiply the output signal ($F_{VCO}$) of the VCO 76 by a divided local oscillator signal ($F_{LO2}$). The divided local oscillator signal ($F_{LO2}$) is provided by the divider 82, which operates to divide the local oscillator signal ($F_{LO}$) from the second FN-PLL 44 by the integer divide value (N2). The divider 82 may alternatively be a fractional-N divider. It should be noted that the divider 82 is optional, and the local oscillator signal ($F_{LO}$) may alternatively be provided to the mixer 78. Further, additional divider circuits may be placed between the VCO 76 and the mixer 78 depending on the particular implementation.

In operation, the mixer 78 multiplies the output signal ($F_{VCO}$) of the VCO 76 and the divided local oscillator signal ($F_{LO2}$) to provide the intermediate frequency signal ($F_{IF}$). Note that the output of the mixer 78 may include a high frequency component at a frequency equal to the frequency of the signal ($F_{VCO}$) plus the frequency of the divided local oscillator signal ($F_{LO2}$) and a low frequency component at a frequency equal to a difference of the frequency of the signal ($F_{VCO}$) and the frequency of the divided local oscillator signal ($F_{LO2}$), as commonly known. Thus, the output of the mixer 78 may optionally be filtered by the feedback filter 80 to remove either the high frequency component or the low frequency component depending on the particular implementation to thereby provide the intermediate frequency signal ($F_{IF}$) to the phase detector 72. In this illustrated embodiment, the filter 80 is a low-pass filter such that the low frequency component is provided to the phase detector 72.

The second FN-PLL 44 and the translational PLL 46 are similar to the Fractional-N Offset PLL (FN-OPLL) disclosed commonly owned and assigned U.S. patent application Ser. No. 11/047,258, entitled FRACTIONAL-N OFFSET PHASE LOCKED LOOP, filed Jan. 31, 2005, which is hereby incorporated herein by reference in its entirety.

The frequency synthesizer 24 of the present invention offers substantial benefits. First, AFC is performed for both the first and second FN-PLLs 42 and 44 based on a single AFCD value. Thus, the same AFCD value is used for the baseband local oscillator signal (BB_LO), the receiver local oscillator signal (RX_LO), and the transmitter local oscillator signal (TX_LO). Second, in the preferred embodiment described herein, the AFCD value is a multiplicative AFCD value. More specifically, the AFCD value is applied to the ideal, or nominal, fractional divide values of the first and second FN-PLLs 42 and 44 as a multiplicative AFC value corresponding to the reference frequency error ratio, or ppm error, of the reference oscillator 40. As such, the AFCD value does not change versus frequency. As a result, there is no need to change the AFCD value as the desired transmit or receive frequencies change. However, it should be noted that the AFCD value may alternatively be additive, where the corrected fractional divide values would be the ideal fractional divide values plus or minus some AFC term. While an additive AFCD value would vary depending on the desired frequency, the frequency synthesizer 24 provides a substantial benefit in that the AFCD value would not change when switching between transmit and receive mode. This is due to the fact that the second FN-PLL 44 and the translational PLL 46 provide the transmitter and receive local oscillator signals (TX_LO, RX_LO) separately.

Another benefit of the frequency synthesizer 24 is that the frequency of the baseband local oscillator signal (BB_LO) may be changed to accommodate a multimode mobile terminal having modes requiring different baseband clock frequencies. For example, the mobile terminal 10 may have a GSM mode of operation and a Wideband Code Division Multiple Access (WCDMA) mode of operation, where the GSM mode of operation may require a 26 MHz baseband clock and the WCDMA mode of operation may require a 38.4 MHz baseband clock. By controlling the ideal, or nominal, fractional divide value ($N_{REF0}$), or alternatively the AFCD value provided to the fractional-N divider 56, the first FN-PLL 44 may be controlled to obtain the baseband LO signal at the desired frequency.

Figure 3:
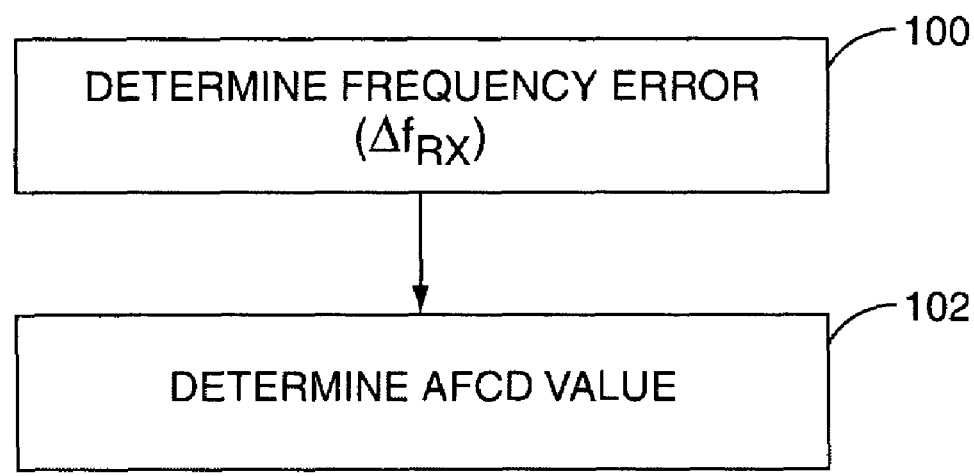
FIG. 3 illustrates a process for determining a digital Automatic Frequency Control (AFC) value for the frequency synthesizer of FIG. 2 according to one embodiment of the present invention.

FIG. 3 illustrates the process for generating the AFCD value. In general, a frequency error ($\Delta f_{RX}$) is first determined (step 100). As will be apparent to one of ordinary skill in the art, in GSM systems and the like, the frequency error ($\Delta f_{RX}$) may be computed by the mobile terminal 10 based on a Frequency Control Burst (FCB) on a Frequency Control Channel (FCCH), or the like, provided by a nearby basestation. For GSM, the FCB provides a 67.708 kHz tone, which may be used by the baseband processor 20 and/or the control system 22 to compute the frequency error ($\Delta f_{RX}$) at the output of the VCO 64. In the following example, the frequency error ($\Delta f_{RX}$) is a frequency error at the output of the VCO 64. However, the frequency error may alternatively be computed to be the frequency error at the output of the divider 68. The details of how the frequency error ($\Delta f_{RX}$) is computed are not central to the present invention and will be apparent to one of ordinary skill in the art upon reading this disclosure.

After determining the frequency error ($\Delta f_{RX}$), the mobile terminal 10 determines the desired AFCD value (step 102). More specifically, for an uncorrected reference signal ($F_{REF}$) output by the reference oscillator 40, the frequency error at the output of the VCO 64 of the second FN-PLL 44 generating the receiver LO signal (RX_LO) may be represented as:

$$\Delta f_{RX} = f_{RX} - f_{RX0} = F_{REF} \cdot N_0 - F_{REF0} \cdot N_0,$$

where $f_{RX}$ is the uncorrected frequency of the output of the VCO 64, $f_{RX0}$ is the ideal, or desired, frequency of the output of the VCO 64, $F_{REF}$ is the frequency of the reference signal ($F_{REF}$), and $F_{REF0}$ is the ideal, or desired, frequency of the reference signal ($F_{REF}$).

To compute the AFCD value, the corrected frequency error ($\Delta f_{RX}'$) may be represented as:

$$\Delta f_{RX}' = f_{RX} - f_{RX0} = F_{REF} \cdot N_0 \cdot (1 + \text{AFCD}) - F_{REF0} \cdot N_0.$$

Since the corrected frequency error ($\Delta f_{RX}'$) is ideally zero, the equation becomes:

$$\Delta f_{RX}' = f_{RX} - f_{RX0} = F_{REF} \cdot N_0 \cdot (1 + \text{AFCD}) - F_{REF0} \cdot N_0.$$

By rearranging the terms, the equation becomes:

$$\Delta f_{RX}' = 0 = F_{REF} \cdot N_0 \cdot \text{AFCD} + F_{REF} \cdot N_0 - F_{REF0} \cdot N_0,$$

which is equal to:

$$\Delta f_{RX}' = 0 = F_{REF} \cdot N_0 \cdot \text{AFCD} + \Delta f_{RX}.$$

Solving for AFCD yields:

$$AFCD = \frac{-\Delta f_{RX}}{F_{REF} \cdot N_0} \approx \frac{-\Delta f_{RX}}{F_{REF0} \cdot N_0} = \frac{-\Delta f_{RX}}{F_{RX}} = \frac{-\Delta f_{RX}}{935 + 0.2 \cdot (ARFCN)}.$$

ARFCN is the Actual Radio Frequency Channel Number. Thus, the value 935+0.2 (ARFCN) is a known value. Thus, AFCD is a ratio of frequency error over frequency and is equivalent to a reference frequency error ratio ($F_{REF0} - F_{REF}$)/$F_{REF0}$) of the reference oscillator 40.

The present invention provides substantial opportunity for variation without departing from the spirit or scope of the present invention. For example, the mobile terminal 10 of FIG. 1 operates according to a polar modulation scheme wherein the phase or frequency modulation component is applied to the frequency synthesizer 24, and more specifically the fractional-N divider 70, to provide the phase modulation signal at the desired radio frequency, which is then provided to the RF input of the power amplifier circuitry 36. However, the present invention is not limited thereto. For example, the radio frequency transmitter section 14 may alternatively be a quadrature transmitter, and the frequency synthesizer 24, and more specifically the translational PLL 46, may alternatively provide the transmitter local oscillator signal (TX_LO) to the radio frequency transmitter section 14 for upconversion of a transmit signal to a desired radio frequency. The frequency synthesizer 24 of the present invention may be used in any mobile terminal, or similar system, wherein AFC is desired to correct for a frequency error of a reference oscillator, such as the reference oscillator 40. Further, while the present invention has been described above with respect to the GSM standard, the present invention is not limited thereto. The frequency synthesizer 24 of the present invention is equally applicable to a mobile terminal operating according to any cellular standard such as, but not limited to, the 3G WCDMA standard, the IS-95 Code Division Multiple Access (CDMA) standard, or the like.

Further, the frequency synthesizer 24 of FIG. 2 includes multiple optional dividers, namely the dividers 48, 58, 68, 82, and 84. Although not illustrated, additional or alternative dividers may be placed within the frequency synthesizer 24 as desired for a particular implementation. For example, additional or alternative dividers may be placed between the reference oscillator 40 and the phase detector 60 of the second FN-PLL 44, between the VCO 54 and the fractional-N divider 56, between the VCO 64 and the fractional-N divider 66, and/or between the VCO 76 and the mixer 78. Still further, the dividers 58, 68, and 84 may each be implemented as one or more dividers. For example, the divider 58 may be implemented as two dividers coupled in series, wherein the output of the first divider is a first baseband clock signal at a first desired frequency and the output of the second divider is a second baseband clock signal at a second desired frequency.

Those skilled in the art will recognize improvements and modifications to the preferred embodiments of the present invention. All such improvements and modifications are considered within the scope of the concepts disclosed herein and the claims that follow.

What is claimed is:

1. A system comprising:
  a reference oscillator adapted to provide a first reference signal;
  a first fractional-N phase-locked loop (FN-PLL) adapted to provide a first baseband local oscillator signal based on the first reference signal and comprising first fractional-N divider circuitry controlling a frequency of the first baseband local oscillator signal based on a first nominal fractional divide value corresponding to a desired frequency of the first baseband local oscillator signal and a first automatic frequency control (AFC) value computed to compensate for a frequency error of the reference oscillator;
  a second fractional-N phase-locked loop (FN-PLL) adapted to provide a first receive local oscillator signal based on the first reference signal and comprising second fractional-N divider circuitry controlling a frequency of the first receive local oscillator signal based on a second nominal fractional divide value corresponding to a desired frequency of the first receive local oscillator signal and a second AFC value computed to compensate for the frequency error of the reference oscillator;
  third fractional-N divider circuitry adapted to receive the first receive local oscillator signal and provide a second reference signal based on the first receive local oscillator signal; and
  a translational loop adapted to provide a first transmit local oscillator signal based on the second reference signal.

2. The system of claim 1 wherein the first AFC value is related to the second AFC value.

3. The system of claim 1 wherein the first AFC value is essentially equal to the second AFC value.

4. The system of claim 1 wherein the first and second AFC values are multiplicative AFC values.

5. The system of claim 1 wherein the first nominal fractional divide value and the first AFC value are combined to provide a first corrected fractional divide value for the first fractional-N divider circuitry based on the equation:

$$N_1 = N_{0,1} \cdot (1 + AFCD_1),$$

wherein $N_1$ is the first corrected fractional divide value, $N_{0,1}$ is the first nominal fractional divide value, and $AFCD_1$ is the first AFC value.

6. The system of claim 5 wherein the second nominal fractional divide value and the second AFC value are combined to provide a second corrected fractional divide value for the second fractional-N divider circuitry based on the equation:

$$N_2 = N_{0,2} \cdot (1 + AFCD_2),$$

wherein $N_2$ is the second corrected fractional divide value, $N_{0,2}$ is the second nominal fractional divide value, and $AFCD_2$ is the second AFC value.

7. The system of claim 6 wherein the first AFC value is related to the second AFC value.

8. The system of claim 6 wherein the first AFC value is essentially equal to the second AFC value.

9. The system of claim 1 further comprising:
  radio frequency (RF) receive circuitry adapted to receive and down-convert RF receive signals into baseband receive signals based on the first receive local oscillator signal; and
  a baseband processor adapted to receive and process the baseband receive signals based on the first baseband local oscillator signal.

10. The system of claim 9 wherein the first AFC value is based on timing of some of the baseband receive signals.

11. The system of claim 10 wherein the second AFC value is based on the timing of the some of the baseband receive signals.

12. The system of claim 11 wherein a baseband processor clock signal is based on the first baseband local oscillator signal.

13. The system of claim 12 wherein the baseband processor clock signal is synchronized to the some of the baseband receive signals.

14. The system of claim 13 wherein the baseband processor is further adapted to provide a baseband transmit signal based on the first baseband local oscillator signal.

15. The system of claim 14 further comprising RF transmit circuitry adapted to provide an RF transmit signal based on the first transmit local oscillator signal and the baseband transmit signal.

16. The system of claim 15 wherein the baseband transmit signal is based on the baseband processor clock signal.

17. The system of claim 16 wherein a frequency of the first reference signal is equal to about 26 megahertz.

18. The system of claim 1 further comprising a divider adapted to provide a second baseband local oscillator signal based on dividing the first baseband local oscillator signal.

19. The system of claim 1 further comprising a divider adapted to provide a second receive local oscillator signal based on dividing the first receive local oscillator signal.

20. The system of claim 1 further comprising a divider adapted to provide a second transmit local oscillator signal based on dividing the first transmit local oscillator signal.

* * * * *